United States Patent [19]
Tang et al.

[11] Patent Number: 5,120,671
[45] Date of Patent: Jun. 9, 1992

[54] PROCESS FOR SELF ALIGNING A SOURCE REGION WITH A FIELD OXIDE REGION AND A POLYSILICON GATE

[75] Inventors: Daniel N. Tang, San Jose; Wen-Juei Lu, Sunnyvale, both of Calif.

[73] Assignee: Intel Corporation, Santa Clara, Calif.

[21] Appl. No.: 621,284

[22] Filed: Nov. 29, 1990

[51] Int. Cl.$^5$ ............................................. H01L 21/76
[52] U.S. Cl. ..................................... 437/43; 437/69; 437/984
[58] Field of Search ................... 357/23.5; 437/41, 43, 437/63, 69, 70, 915, 984; 148/DIG. 70

[56] References Cited

U.S. PATENT DOCUMENTS

| | | | |
|---|---|---|---|
| 4,620,361 | 11/1986 | Matsukawa et al. | 437/43 |
| 4,814,286 | 3/1989 | Tam | 437/43 |
| 4,861,730 | 8/1989 | Hsia et al. | 437/43 |

FOREIGN PATENT DOCUMENTS 0001946  1/1990  Japan ..................................... 437/69

OTHER PUBLICATIONS

Ghandhi, S. K., "VLSI Fabrication Principles", pp. 499-509, pp. 534-541, 1983.

Primary Examiner—Brian E. Hearn
Assistant Examiner—C. Chaudhari
Attorney, Agent, or Firm—Blakely, Sokoloff, Taylor & Zafman

[57] ABSTRACT

A method and apparatus for self-aligning a source region with a field oxide region and a polysilicon gate and word line in a semiconductor device. This method and apparatus allows reduced memory cell size and improved device density by substantially eliminating the bird's beak encroachment and corner rounding effects usually found between neighboring cells due to inadequacies in the prior art photolithography process. This method and apparatus is particularly appropriate for use with EPROM, Flash EPROM, EEPROM, or other types of memory cells and in periphery devices.

16 Claims, 4 Drawing Sheets

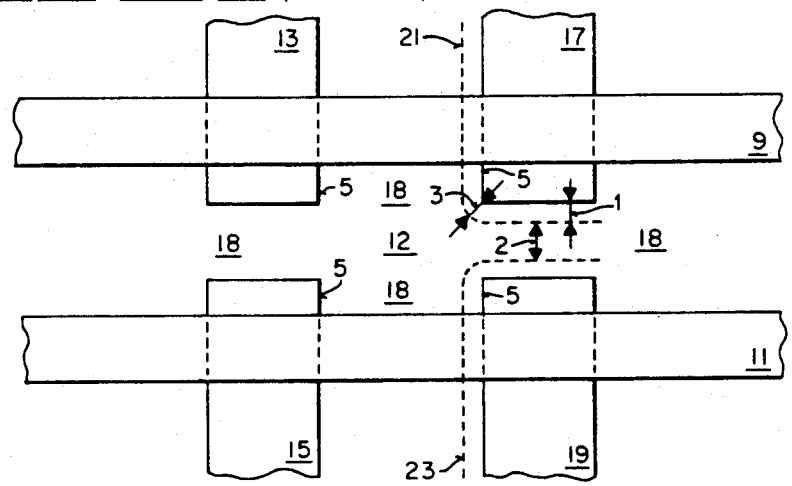
FIG_1 (PRIOR ART)
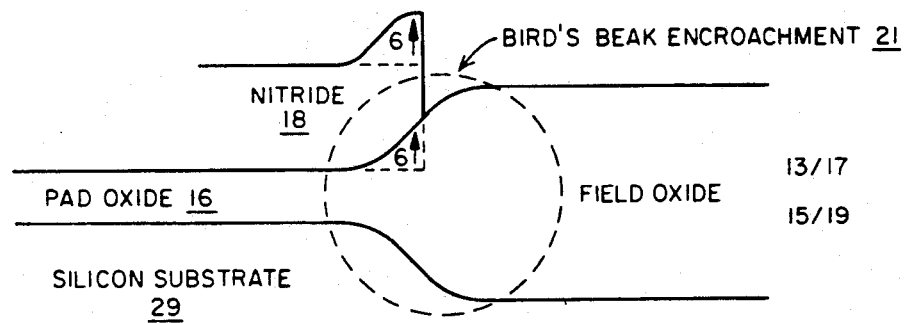
FIG_2 (PRIOR ART)
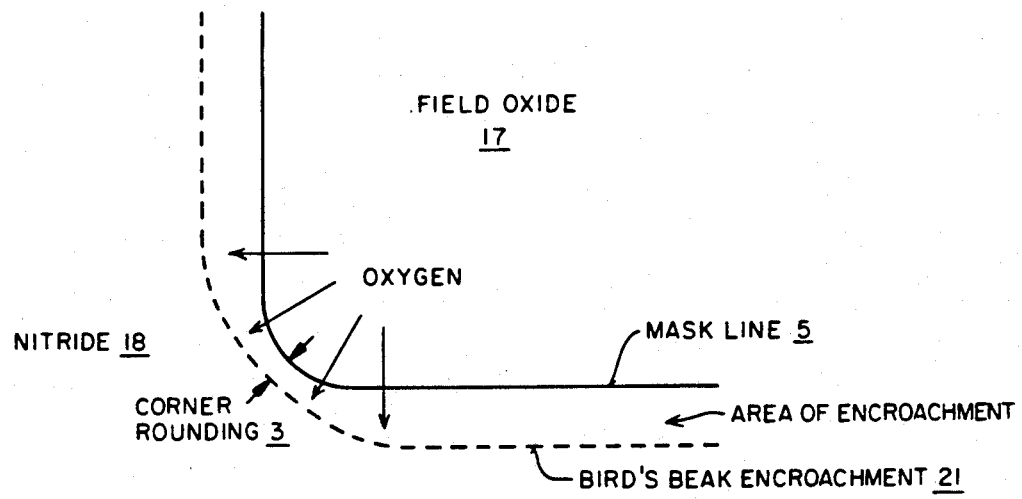
FIG_3 (PRIOR ART)

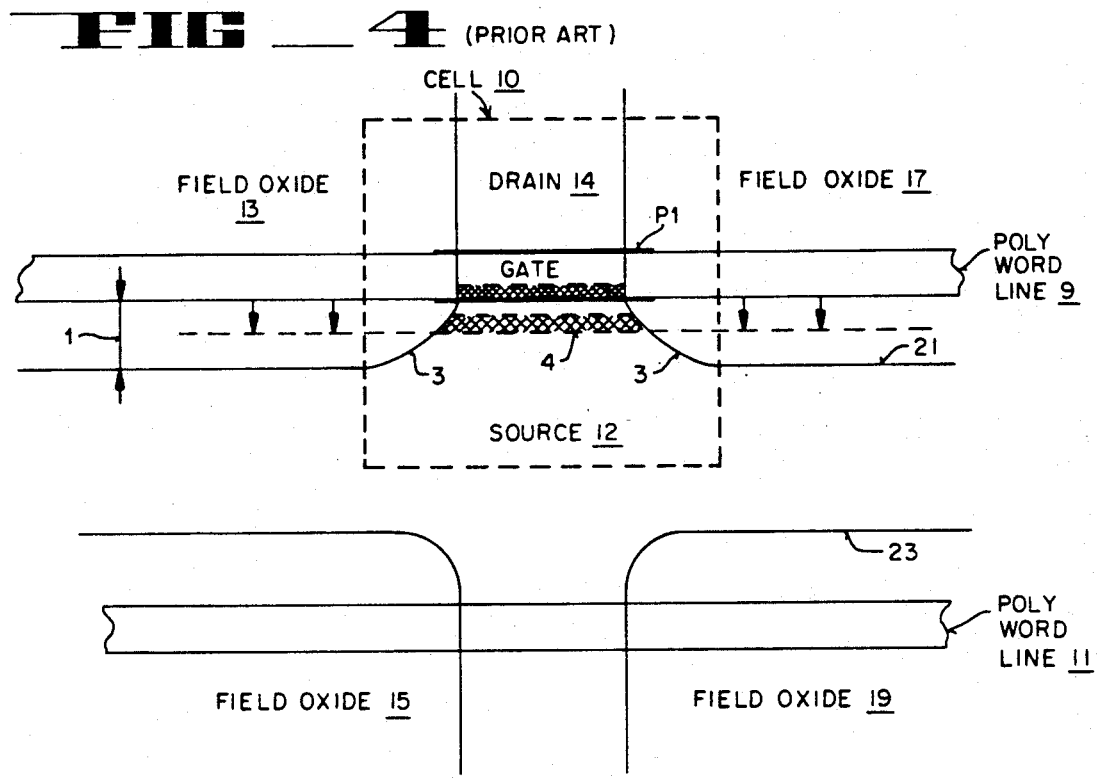
FIG_4 (PRIOR ART)
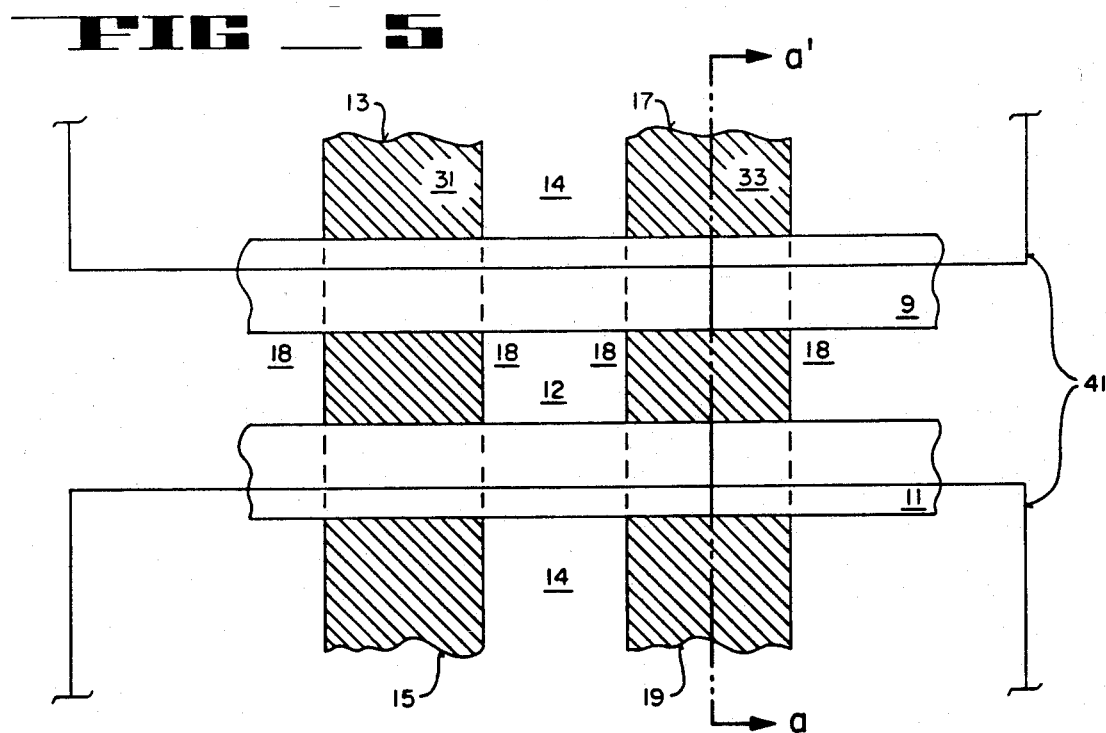
FIG_5

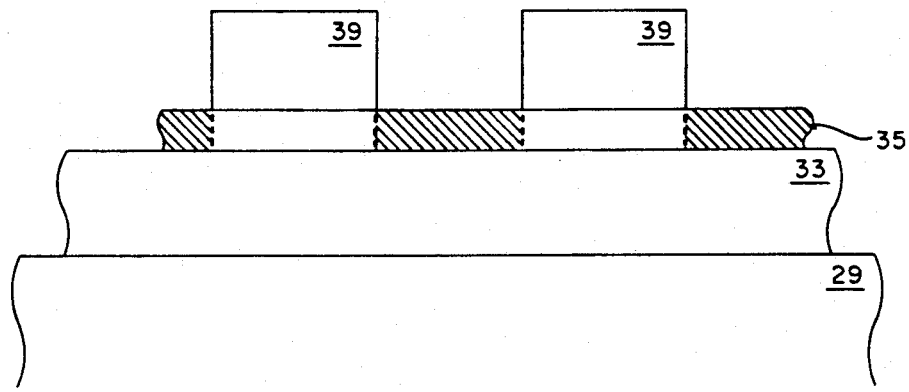
FIG_6
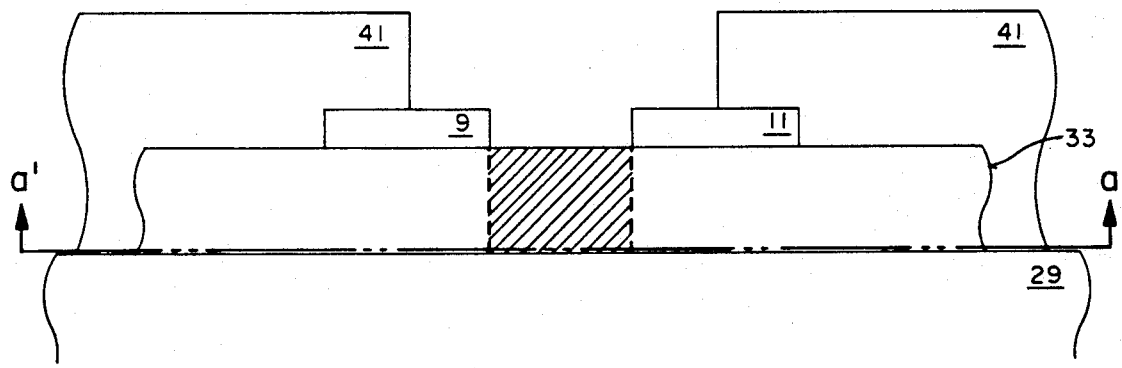
FIG_7
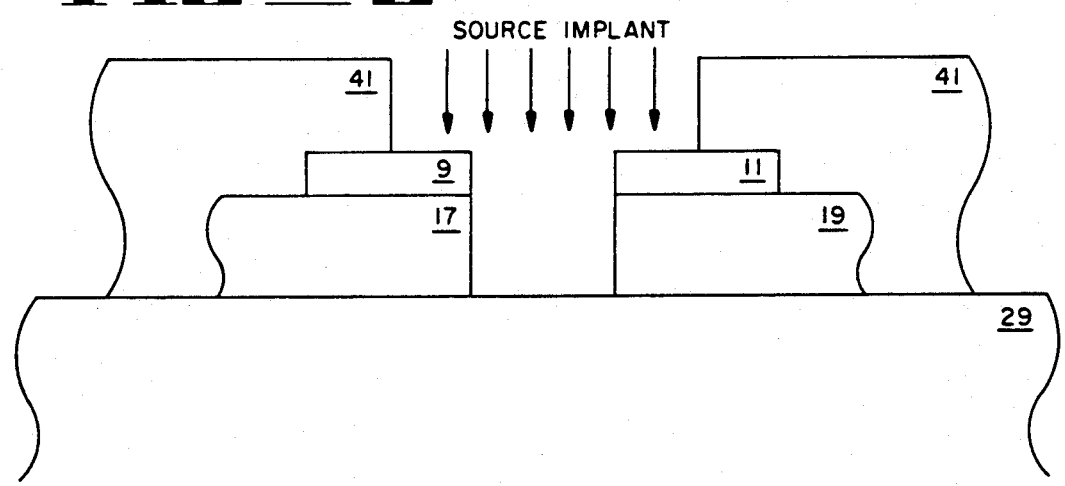
FIG_8

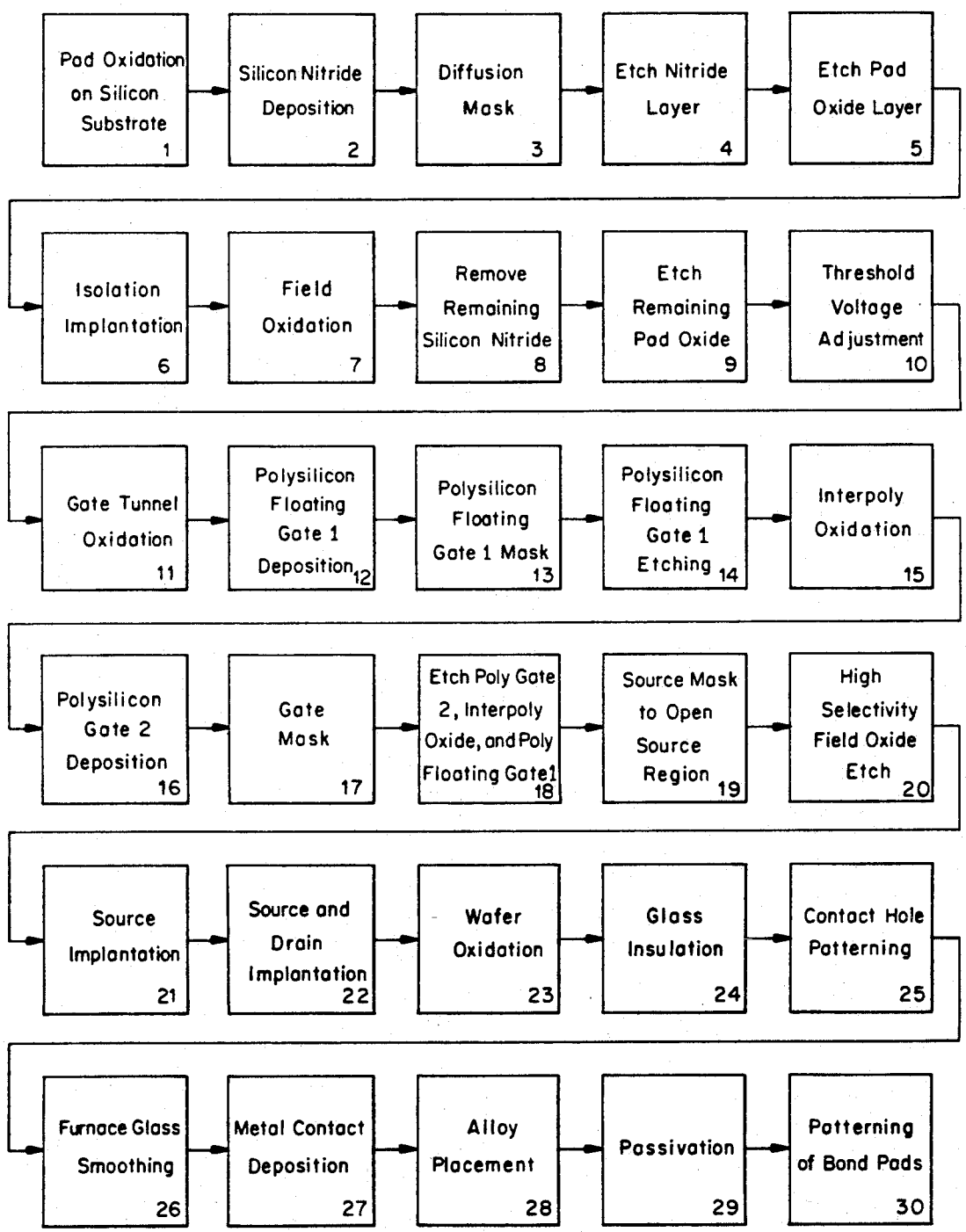
FIG — 9

PROCESS FOR SELF ALIGNING A SOURCE REGION WITH A FIELD OXIDE REGION AND A POLYSILICON GATE

FIELD OF THE INVENTION

The present invention relates to the field of semiconductor devices. More particularly, this invention relates to the etching process used to form a source region of such devices and to the semiconductor device formed thereby.

BACKGROUND OF THE INVENTION

The traditional EPROM/Flash EPROM memory cell layout, as shown in a top view in FIG. 1, uses a common source line 12 defined by a diffusion process. Polysilicon ("poly") word lines 9 and 11, usually formed by a photolithography process, run parallel to this source line 12. Field oxide regions 13 and 17, usually formed between nitride regions 18 using a photolithography process, serve to isolate the active regions of the device.

Due to limitations in the oxidation process and the photolithography process used to form field oxide regions 13 and 17, the regions do not exactly match the size and dimensions of a mask 5 used to create them. Instead what occurs is a lateral growing of the field oxide regions 13 and 17 beyond the boundaries of the mask 5, as indicated by reference number 21. This lateral growth/formation is commonly referred to as "bird's beak encroachment" due to its shape.

FIG. 2 shows a side view of the bird's beak encroachment 21. The bird's beak encroachment 21 is created when the field oxide regions 13 and 17 are formed by diffusion into the pad oxide 16. This diffusion process causes the field oxide to also diffuse into the underlying silicon substrate 29 as well as underneath, thus physically lifting, the protective nitride layer 18 as is indicated by reference number 6. It is this diffusion into the silicon substrate 29 and lifting of the nitride layer 18 which creates the field oxide formation that resembles a bird's beak.

A problem with bird's beak encroachment is that it requires the diffusion line width 2, referring again to FIG. 1, to be drawn wider. That is, bird's beak encroachment 21 and 23 of the field oxide regions 17 and 19 requires placing the poly word lines 9 and 11 further apart so as to prevent the encroachment of neighboring field oxide regions 17 and 19 from contacting each other. This separation is necessary in order to leave room for the source line 12. This additional spacing of the diffusion line width 2 can't follow the same scaling factor as technologies advance toward finer geometry because it will consume a larger and larger percentage of the cell real estate as cell sizes become smaller and smaller.

FIG. 3 shows a top view of field oxide region 17. Not only does the field oxide diffusion create a bird's beak 21 which spreads beyond the original mask line 5, but the field oxide region 17 also does not yield square corners. This is initially due to optical resolution limitations in the photolithography process which cause the corners of the photoresist mask pattern to become slightly rounded when the mask shape is transferred to the photoresist. Then, due to the lower amount of oxygen available at a corner than at a side of the field oxide region, lateral diffusion or oxidation occurs more slowly in the corners than in areas relatively distanced from a corner. Photolithography optical resolution limitations and slower lateral oxidation at the corner thus create a corner rounding effect 3 of the bird's beak encroachment 21 of the field oxide region 17.

These corner rounding effects can seriously affect the behavior of an EPROM or Flash EPROM memory device. Referring now to FIG. 4, and with respect to Cell 10, as the edge of poly word line 9 is formed more closely to the ends of field oxide regions 13 and 17 thus reducing distance 1, corner rounding 3 can contribute to an increased gate-to-source tunneling area, as shown by the enlarged gray area 4. This increased gate-to-source tunneling area 4 increases the associated tunnel area capacitance which degrades the tunnel erase process. This occurs whenever the polysilicon word lines are misaligned relative to the field oxide regions having rounded corners.

Normally, this mis-alignment poses no serious problem to the fabrication of reliable integrated circuits because it is a relatively simple matter to form the poly word line 9 a large enough distance 1 from the ends of the field oxide regions 13 and 17 to avoid the corner rounding. However, the dead spaces caused by indenting the overlap of the poly word line on the field oxide to avoid corner rounding effects will consume a larger and larger percentage of the cell real estate as cell sizes become smaller and smaller.

As will be seen, the present invention provides a method for forming a source region which is self-aligned with the poly word line as well as an apparatus formed thereby. In the present invention, the end edges of the field oxide regions are vertically aligned with the poly word line with no bird's beak encroachment and corner rounding effect remaining in what will become the source region. The source region, formed between the ends of the field oxide regions of neighboring cells, is thus self-aligned with both the field oxide regions and the poly gate word lines. This self-alignment of the source region allows closer placement of poly word lines without any decrease in source width which thus requires less physical separation between (allows closer placement of) one memory cell and the next memory cell. Reduced cell size and greater overall device density is thus achieved.

SUMMARY AND OBJECTS OF THE INVENTION

One objective of the present invention is to provide a method of self-aligning a source region in a semiconductor device with field oxide regions and polysilicon word lines.

Another objective of the present invention is to provide a method of self-aligning the source region in a semiconductor device with the field oxide layer and the overlaying polysilicon layer such that neighboring cells can be placed more closely together.

Still another objective of the present invention is to provide an apparatus where an underlying field oxide layer connects overlaying substantially parallel polysilicon word lines.

Yet another objective of the present invention is to provide a semiconductor device having a third region, formed in a substrate, vertically coincident to edges of both a gate member and the parallel regions connected by the gate member.

These and other objects of the present invention are provided for by a method of forming a self-aligned region in a semiconductor device. This self-alignment is accomplished by forming a first layer on a substrate of the semiconductor device and then forming a second layer on top of the first layer. Select portions of the second layer are then removed, thus exposing a portion of the underlaying first layer. The exposed portion of the first layer are then removed thus creating vertical alignment between the underlying first layer and the overlaying second layer. Forming the self-aligned region in the substrate where the first and second layers have been removed self-aligns the region with the first and second layers.

These and other objects of the present invention are provided for by a memory cell formed in a silicon substrate of one conductivity type. The memory cell has two spaced-apart substantially parallel regions of another conductivity type formed in the silicon substrate, and an insulated gate member with an edge coincident to the two parallel regions on top of and connecting them. Lastly, the memory cell has a third region of still another conductivity formed in the substrate coincident to the ends of the two parallel regions and coincident to the edge of the gate member.

Other objects, features, and advantages of the present invention will be apparent from the accompanying drawings and from the detailed description which follows below.

BRIEF DESCRIPTION OF THE DRAWINGS

The present invention is illustrated by way of example and not limitation in the figures of the accompanying drawings, i which like references indicate similar elements, and in which:

FIG. 1 depicts a top view of a prior art memory cell layout;

FIG. 2 depicts a cross-sectional side view of a bird's beak encroachment in a prior art memory cell;

FIG. 3 depicts a top view of the corner rounding effect of the bird's beak encroachment in a prior art memory cell;

FIG. 4 depicts a top view of the increased gate-to-source tunneling area as a polysilicon word line approaches the ends of field oxide regions in a prior art memory cell;

FIG. 5 depicts a top view of a memory device formed in accordance with the present invention;

FIG. 6 depicts a cross-sectional side view of a portion of the memory device of FIG. 5 before etching the polysilicon of the present invention;

FIG. 7 depicts a cross-sectional side view of a portion of the memory device of FIG. 5 after etching the polysilicon and before etching the field oxide of the present invention;

FIG. 8 depicts a cross-sectional side view of a portion of the memory device of FIG. 5 after etching the field oxide of the present invention;

FIG. 9 depicts the process flow of the present invention as applied to a metal oxide semiconductor (MOS) double polysilicon floating gate memory device.

DETAILED DESCRIPTION

A method and apparatus for self-aligning a source diffusion to field oxide regions, poly word lines and gate edges is disclosed. In the following description, numerous specific details are set forth, such as specific materials, devices, process steps, dimensions, etc., in order to provide a thorough understanding of the present invention. It will be obvious, however, to one skilled in the art that these specific details need not be employed to practice the present invention. In other instances, well-known processing steps and device configurations are not described in detail in order not to unnecessarily obscure the present invention.

The present invention discloses a method and an apparatus to allow a source diffusion node of a semiconductor device to be defined by a self-aligned method to edges of field oxide regions, poly word lines and gate edges of the device. This method and apparatus saves silicon real estate by reducing spaces reserved for layer registration, field oxide bird's beak encroachment and lithographic/field oxidation induced isolation corner rounding. This method and apparatus is particularly appropriate for use with EPROM, Flash EPROM, EEPROM, or other types of memory cells and in periphery devices.

With reference to the drawings, FIG. 5 illustrates a top view of a portion of a memory device formed i accordance with the present invention. In the preferred embodiment, field oxide regions 31 and 33 are formed by growing oxide between parallel rows of nitride regions 18 to form the field oxide regions 31 and 33 as continuous lines across the source line 12, rather than as separate field oxide regions (reference nos. 13, 15, 17 and 19 in FIG. 1) formed in the openings of a latticework of nitride regions 18 as is known in the prior art (and as shown in FIG. 1). A layer of polysilicon is then deposited over the field oxide regions 31 and 33. After placing a photoresist mask over the polysilicon, the portions of the polysilicon left exposed are etched away. The remaining portions of polysilicon are poly word lines 9 and 11, which run parallel to source line 12.

Etching the polysilicon to form poly word lines 9 and 11 exposes the underlying field oxide regions 31 and 33 in the region of source line 12. In the preferred embodiment of the present invention a source mask 41 is then placed over the memory device and the oxide regions 31 and 33 are then etched away where they were exposed by the etching of poly word lines 9 and 11. This field oxide etch, which uses a high selectivity etch, as is discussed in more detail below, reduces field oxide regions 31 and 33 into separate field oxide regions 13, 15, 17 and 19. More importantly, this field oxide etch aligns field oxide regions 13 and 15, as well as 17 and 19, with the edges of poly word lines 9 and 11. Thus, in the preferred embodiment, when source implantation occurs it is self-aligned to the coincident edges of the field oxide and the polysilicon regions.

It is important to note that the source mask 41 is not used to align the source region implantation with the edges of the poly word lines. Instead, in the preferred embodiment of the present invention, the source mask 41 is placed on the memory device to protect (during both the source region etching and the source region implantation) the portions of the field oxide regions 31 and 33 which reside on the other side of the poly word lines 9 and 11 from the source region 12 and between which the drain regions 14 will later be formed.

The formation and resulting alignment of field oxide regions 17 and 19 with poly word lines 9 and 11 is further shown in side views in FIGS. 6-8. Referring now to FIG. 6, field oxide 33 is formed on the silicon substrate 29. Polysilicon 35 is then deposited on the field oxide 33. A photoresist mask 39 is then placed on top of the polysilicon 35 leaving select portions of the polysilicon exposed. Note that a direct write technique, using for example an electron beam or a laser beam, could also be used to create the mask pattern in the photoresist.

Etching the exposed polysilicon 35 through the photoresist mask 39 of FIG. 6 yields the formation, as shown in FIG. 7, where the only remaining polysilicon is that which was protected by the opaque portions of photoresist mask 39. The remaining polysilicon portions are poly word lines 9 and 11. Note that FIG. 7 represents a cross-sectional view of FIG. 5 along line a—a' and shows the continuous field oxide layer 33 underlying poly word lines 9 and 11 instead of the separate field oxide regions 17 and 19 of FIG. 1 as is known in the prior art.

Having formed poly word lines 9 and 11, by etching the exposed polysilicon through the mask 39, exposes portions of the underlying field oxide 33. In the preferred embodiment, mask 41 is then placed on the device to protect the drain regions and then the field oxide portions are etched away using a high selectivity oxide etch, as is discussed more fully below. Referring now to FIG. 8, after etching field oxide 33, the portions that remain are field oxide regions 17 and 19 without the bird's beak encroachment or corner rounding effect as is known in the prior art. Lastly, the portions of silicon substrate 29 exposed by the field oxide etch are ready for source/drain implantation.

Thus, in the preferred embodiment, etching the field oxide exposed by the previously etched polysilicon allows a vertical alignment of the field oxide with the poly word lines and virtually eliminates the bird's beak encroachment and corner rounding effect in the source region. Then, in the preferred embodiment, implantation of the source/drain regions will necessarily be self-aligned to the field oxide, the gates and the poly word lines.

The present invention has application to both single poly gate and double poly floating gate devices. Additionally, the present invention can be used in the fabrication of periphery devices to meet tight pitch (distance between devices) requirements of those devices.

FIG. 9 shows the process flow of the present invention as applied to a metal oxide semiconductor ("MOS") double poly floating gate memory device. In step 1 of the MOS fabrication process, a silicon substrate wafer is oxidized in a furnace to grow a thin layer of silicon dioxide (SiO2) on the surface. This first silicon dioxide layer is known as the "pad oxide." In step 2, silicon nitride is deposited on the oxidized wafer in a gas phase chemical reactor. A diffusion pattern mask is then placed on the nitride layer, step 3, to protect and define the areas where the active regions of the device will be formed. The exposed regions of the nitride are etched away, in step 4, to expose portions of the underlying pad oxide. In step 5, the exposed pad oxide regions are then also etched away thus exposing the silicon substrate except, again, where the active regions of the device will be formed.

Step 6 takes the patterned and etched wafer and implants it with additional boron atoms accelerated at high energy. The boron will only reach the silicon substrate where the nitride and oxide was etched away, providing areas doped strongly p-type that will electrically separate active areas. After implanting, the wafers are oxidized again, in step 7, which grows a thick oxide this time. This thick oxide is known as the "field oxide." The oxide only grows in the etched areas due to silicon nitride's properties as an oxidation barrier. When the field oxide is grown, some of the silicon substrate is consumed and the silicon nitride is lifted slightly at the edges creating a bird's beak formation, as was discussed with reference to FIG. 2. Having fulfilled its purpose, the remaining silicon nitride layer is removed in step 8. In step 9, a light oxide etch removes the underlying pad oxide but leaves the thick field oxide.

Now that the active region has been defined and isolated, the transistor threshold voltage is adjusted in step 20 by implanting p-type dopant atoms. Step 11 grows the gate tunnel oxide in a high temperature furnace. In step 12, the wafers are then deposited with a first layer of gate material. This is typically poly crystalline silicon ("poly") which is deposited in a gas phase chemical reactor similar to that used for silicon nitride. A poly 1 mask is then laid on top in step 13 and the poly 1 is then etched in step 14. Next, step 15, an interpoly oxide is formed on top of the first gate layer. Deposition of a second gate layer, step 16, is then formed with a mask pattern laid on top, in step 17, to define the gates of the cell device. It is at this point in the process that the formation as shown in a cross-sectional view in FIG. 6 can be found. In step 18, etching the second polysilicon layer, then the interpoly oxide, and lastly, the first polysilicon layer creates the double poly floating gate formation of a flash memory device.

Another mask is placed on the double poly floating gate formation, in step 19, to open the source region. It is at this point in the process that the formation as shown in a cross-sectional view in FIG. 7 can be found. It is also at this point that a continuous field oxide region exists which connects neighboring overlaying polysilicon work lines.

The wafer is then etched again, in step 20, using a high selectivity oxide etch (as explained more fully below) to remove the field oxide at the source side of the device. This oxide etch, using the gate as a protective barrier to the desired portions of the field oxide layer, causes a vertical self-alignment of the field oxide with the gate (as was shown in a cross-sectional view in FIG. 8) and substantially eliminates the bird's beak formation.

In step 21, the wafer is implanted on the source side with a phosphorous dopant and lastly, in step 22, with n-type dopants (typically arsenic) to form the source and drain junctions. The transistor gate material acts as a barrier to the dopant providing an undiffused channel self-aligned to the two junctions. The wafer is then oxidized, in step 23, to seal the junctions from contamination with a layer of silicon dioxide.

A thick layer glass is then deposited over the wafer, in step 24, to provide for insulation and sufficiently low capacitance between the underlying layers and the metal interconnect signals. The glass layer is then patterned with contact holes, step 25, and placed in a high temperature furnace, step 26. This furnace step smooths the glass surface and rounds the contact edges to provide uniform metal coverage. Metal (aluminum or aluminum/silicon) is then deposited on the wafer and the interconnect patterns and external bonding pads are defined and etched in step 27. The wafers then receive, in step 28, a low temperature (approximately 400° C.) alloy that insures good ohmic contact between the aluminum and diffusion or poly.

Although the circuit is now fully operational, the top metal layer is very soft and easily damaged by handling. The device is also susceptible to contamination or attack from moisture. To prevent this, in step 29 the wafer is sealed with a passivation layer of silicon nitride or a silicon and phosphorous oxide composite. In step 30, patterning is done for the last time opening windows only over the bond pads where external connections will be made.

In practice, the high selectivity oxide etch in the preferred embodiment was achieved using a plasma etch process with a radio frequency (RF) power of 1200 watts, a chamber pressure of 50 mTorr, and a CHF3 to O2 gas flow rate of of 75:5 standard cubic centimeters per minute (SCCM). This resulted in an oxide to poly etch selectivity ratio of 15 (approximately 15 times more oxide than poly was etched). The etch uniformity across the wafer was found to be better than ±2.8%.

Lastly, use of the present invention has resulted in a 10% reduction in cell size with 1.0 Flash EPROM technology and a 20% reduction in cell size with 0.8 um Flash EPROM technology. This shows an increasing improvement in elimination of dead space as cell size decreases.

In the foregoing specification, the invention has been described with reference to the presently preferred embodiment thereof. It will, however, be evident that various modifications and changes may be made thereto without departing from the broader spirit and scope of the invention as set forth in the appended claims. The specifications and drawings are, accordingly, to be regarded in an illustrative rather than a restrictive sense.

What is claimed is:

1. In a semiconductor device having a silicon substrate, a method of forming source regions in said silicon substrate said source regions self-aligned with polysilicon regions and field oxide regions, said method comprising:
    a) forming continuous substantially parallel field oxide regions on said silicon substrate;
    b) forming continuous substantially parallel gate oxide regions on said silicon substrate between said field oxide regions;
    c) forming continuous substantially parallel polysilicon regions on said continuous substantially parallel field oxide regions and on said continuous substantially parallel gate oxide regions, said continuous substantially parallel polysilicon regions being substantially perpendicular to said continuous substantially parallel field oxide regions and to said continuous substantially parallel gate oxide regions;
    d) etching said continuous substantially parallel field oxide regions and said continuous substantially parallel gate oxide regions exposed between said continuous substantially parallel polysilicon regions using a high selectivity oxide etch;
    e) forming said self-aligned source regions in select portions of said silicon substrate exposed between said continuous substantially parallel polysilicon regions and said etched field oxide regions.

2. The method of claim 1 wherein in step (a) said field oxide regions are thermally grown.

3. The method of claim 2 wherein in step (b) said gate oxide regions are thermally grown.

4. The method of claim 3 wherein in step (c) said continuous substantially parallel polysilicon regions are formed by chemically depositing polysilicon and etching select portions of said polysilicon.

5. The method of claim 4 wherein in step (f) said source regions are formed using ion implantation.

6. The method of claim 5 wherein in step (f) said select portions of said silicon substrate exposed between said continuous substantially parallel polysilicon regions and said etched field oxide regions are selected by forming a mask over non-select portions of said silicon substrate exposed between said continuous substantially parallel polysilicon regions and said etched field oxide regions.

7. The method of claim 6 wherein said etching process in step (e) is achieved with a plasma etch process using a radio frequency (RF) power of 1200 watts.

8. The method of claim 7 wherein said etching process in step (e) is achieved with a plasma etch process having an atmospheric pressure of 50 mTorr.

9. The method of claim 8 wherein said etching process in step (e) is achieved with a plasma etch process having a gas mixture and flow rate of 75 standard cubic centimeters per minute (SCCM) of CHF3 to 5 SCCMs of O2.

10. The method of claim 9 wherein said self-aligned source regions are source regions of an EPROM device.

11. The method of claim 10 wherein said EPROM device is a Flash EPROM device.

12. The method of claim 1 wherein said etching process in step (e) is achieved with a plasma etch process using a radio frequency (RF) power of 1200 watts.

13. The method of claim 12 wherein said etching process in step (e) is achieved with a plasma etch process having an atmospheric pressure of 50 mTorr.

14. The method of claim 13 wherein said etching process in step (e) is achieved with a plasma etch process having a gas mixture and flow rate of 75 standard cubic centimeters per minute (SCCM) of CHF3 to 5 SCCMs of O2.

15. The method of claim 14 wherein said self-aligned source regions are source regions of an EPROM device.

16. The method of claim 14 wherein said self-aligned source regions are source regions of a Flash EPROM device.

* * * * *

UNITED STATES PATENT AND TRADEMARK OFFICE
CERTIFICATE OF CORRECTION

PATENT NO. : 5,120,671
DATED : 06/09/92
INVENTOR(S) : Daniel N. Tang and Wen-JUEI Lu It is certified that error appears in the above-indentified patent and that said Letters Patent is hereby corrected as shown below:

| | | |
|---|---|---|
| Col. 3, Line 2  | Delete "oh" | Insert --on-- |
| Col. 3, Line 33 | Delete "i"  | Insert --in-- |
| Col. 4, Line 19 | Delete "i"  | Insert --in-- |
| Col. 6, Line 9  | Delete "20" | Insert --10-- |

Signed and Sealed this

Third Day of May, 1994

Attest:

Attesting Officer

BRUCE LEHMAN

Commissioner of Patents and Trademarks